(12) United States Patent
Wiegner et al.

(10) Patent No.: US 11,264,720 B2
(45) Date of Patent: Mar. 1, 2022

(54) TUNABLE RADIO-FREQUENCY DEVICE HAVING ELECTROCHROMIC AND ELECTRO-ACTIVE MATERIALS

(71) Applicant: Nokia Technologies Oy, Espoo (FI)

(72) Inventors: Dirk Wiegner, Schwaikheim (DE); Wolfgang Templ, Sersheim (DE); Senad Bulja, Dublin (IE); Rose F. Kopf, Green Brook, NJ (US)

(73) Assignee: Nokia Technologies Oy, Espoo (FI)

( * ) Notice: Subject to any disclaimer, the term of this patent is extended or adjusted under 35 U.S.C. 154(b) by 234 days.

(21) Appl. No.: 16/665,578

(22) Filed: Oct. 28, 2019

(65) Prior Publication Data

US 2021/0124231 A1  Apr. 29, 2021

(51) Int. Cl.
*H01Q 9/04* (2006.01)
*H01Q 9/06* (2006.01)
(Continued)

(52) U.S. Cl.
CPC .......... *H01Q 9/0414* (2013.01); *H01L 41/09* (2013.01); *H01P 1/20345* (2013.01); *H01Q 1/42* (2013.01);
(Continued)

(58) Field of Classification Search
CPC .......... H01Q 1/42; H01Q 3/26; H01Q 9/0407; H01Q 9/0414; H01Q 9/0457; H01Q 9/06;
(Continued)

(56) References Cited

U.S. PATENT DOCUMENTS 7,369,396 B2   5/2008   Maliakal
8,081,114 B2  12/2011   Stuart
(Continued)

FOREIGN PATENT DOCUMENTS

EP   2887449 A1   6/2015
EP   2916364 A1   9/2015
(Continued)

OTHER PUBLICATIONS

Stutzman, Warren .L. et al. "Antenna Theory and Design," 2nd ed. (1998), John Wiley & Sons, New York: p. 215.
(Continued)

*Primary Examiner* — Robert Karacsony
(74) *Attorney, Agent, or Firm* — Mendelsohn Dunleavy, P.C.; Yuri Gruzdkov (57) ABSTRACT

An electrically controllable RF circuit that includes an EC cell and an EAP-based actuator configured to produce relative movement of an electrode of the electrochromic cell and an electrically conducting patch or another electrode electromagnetically coupled thereto. In one embodiment, the RF circuit operates as a tunable patch antenna whose frequency characteristics can be changed by changing the bias voltages applied to the EC cell and EAP-based actuator. Advantageously, the capability to tune the antenna using two different tuning mechanisms (i.e., a dielectric-permittivity based tuning mechanism implemented using the EC cell and a geometry-based tuning mechanism implemented using the EAP-based actuator) provides more degrees of control over the pertinent antenna characteristics compared to what is available in some other antenna designs. In another embodiment, the RF circuit can operate as a tunable RF filter whose frequency characteristics can similarly be changed using these two different tuning mechanisms.

15 Claims, 5 Drawing Sheets

(51) Int. Cl.
*H01Q 1/42* (2006.01)
*H01L 41/09* (2006.01)
*H01P 1/203* (2006.01)

(52) U.S. Cl.
CPC ......... *H01Q 9/0407* (2013.01); *H01Q 9/0442* (2013.01); *H01Q 9/0457* (2013.01); *H01Q 9/06* (2013.01)

(58) Field of Classification Search
CPC ..... H01Q 9/0442; H01L 41/09; H01L 41/193; H01P 1/20345; G02F 1/163
See application file for complete search history.

(56) References Cited

U.S. PATENT DOCUMENTS

| | | | |
|---|---|---|---|
| 10,033,080 | B2 | 7/2018 | Bulja et al. |
| 10,187,107 | B1 | 1/2019 | Bulja et al. |
| 10,320,089 | B2 * | 6/2019 | Jakoby .................. H01Q 3/34 |
| 2012/0062976 | A1 | 3/2012 | Burdis |
| 2013/0201545 | A1 | 8/2013 | Frey et al. |
| 2015/0325897 | A1 * | 11/2015 | Bulja .................... G02F 1/163 333/238 |
| 2015/0331293 | A1 | 11/2015 | Sotzing et al. |
| 2018/0224332 | A1 | 8/2018 | Ooi et al. |
| 2018/0301783 | A1 | 10/2018 | Bulja et al. |
| 2019/0058242 | A1 | 2/2019 | Tabe |
| 2019/0204703 | A1 | 7/2019 | Giri |
| 2019/0346730 | A1 | 11/2019 | Bulja et al. |

FOREIGN PATENT DOCUMENTS

| | | |
|---|---|---|
| EP | 2916385 A1 | 9/2015 |
| EP | 3021419 A1 | 5/2016 |
| EP | 3772773 A1 | 2/2021 |

OTHER PUBLICATIONS

Argun, Avni A., et al. "Multicolored Electrochromism in Polymers: Structures and Devices." Chemistry of Materials 16.23 (2004): 4401-4412.
Wiegner, Dirk et al. "Electrically Tunable Radio-Frequency Components and Circuits", U.S. Appl. No. 16/562,871; filed Sep. 6, 2019, (43 pages).
Mazlouman, Shahrzad Jalali, et al. "Mechanically reconfigurable antennas using electro-active polymers (EAPs)" 2011 IEEE International Symposium on Antennas and Propagation (Apsursi). IEEE (2011): 4 pages.
Bulja, S., et al. "Electro-chromic structure with a high degree of dielectric tunability." Scientific Reports 9.1 (2019): 1-7. (19 pages).
Wang, Wei-Chih, "Electroactive Polymers", Presentation, University of Washington 2006 [retrieved on Sep. 12, 2019]—Retrieved from Internet: <URL: https://depts.washington.edu/mictech/optics/sensors/week7.pdf> (118 pages).
Wang, Shutao, et al. "Tuning the fluorescent response of a novel electroactive polymer with multiple stimuli." Macromolecular Rapid Communications 34.20 (2013): 1648-1653.
Gunter, Daniel et al. "A Comprehensive Guide to Electroactive Polymers (EAP)", University of Pittsburgh 2019 [retrieved on Jan. 13, 2020]—Retrieved from Internet: <URL: http://www.pitt.edu/~qiw4/Academic/MEMS1082/Group%202%20EAPs%20review%20-%20Final%20Paper.pdf> (25 pages).
Ta, Chien M., et al. "A 60-GHz variable delay line on CMOS for steerable antennae in wireless communication systems." 2008 Canadian Conference on Electrical and Computer Engineering. IEEE (2008): 3 pages.
Gong, Songbin et al. "A 60-GHz 2-bit switched-line phase shifter using SP4T RF-MEMS switches." IEEE Transactions on Microwave Theory and Techniques 59.4 (2011): 894-900.
Nasserddine, Victoria "Millimeter-wave phase shifters based on tunable transmission lines in MEMS technology post-CMOS process." Dissertation; Université Grenoble Alpes (2016): 128 pages.
Non-Final Rejection for U.S. Appl. No. 16/562,871; dated Feb. 19, 2021 (8 pages).

* cited by examiner

*FIG. 1A*

PRIOR ART

PRIOR ART

TUNABLE RADIO-FREQUENCY DEVICE HAVING ELECTROCHROMIC AND ELECTRO-ACTIVE MATERIALS

BACKGROUND

Field

Various example embodiments relate to electrical circuits and, more specifically but not exclusively, to tunable electrical circuits.

Description of the Related Art

This section introduces aspects that may help facilitate a better understanding of the disclosure. Accordingly, the statements of this section are to be read in this light and are not to be understood as admissions about what is in the prior art or what is not in the prior art.

Many portable electronic devices, such as laptop computers, cellular and cordless phones, etc., use wireless communication methods to transmit and receive data. One general problem in the design of a portable wireless communication device is associated with its antenna. For example, the cost of incorporating an external antenna and its conduits into the device can add considerably to the cost of the final product. As a result, wireless equipment manufacturers often use planar (e.g., patch) antennas instead of or in addition to external antennas.

SUMMARY OF SOME SPECIFIC EMBODIMENTS

Disclosed herein are various embodiments of an electrically controllable radio-frequency (RF) circuit that includes an electrochromic (EC) cell and an electro-active-polymer (EAP)-based actuator configured to produce relative movement of an electrode of the electrochromic cell and an electrically conducting patch or another electrode electromagnetically coupled thereto. In one example embodiment, the electrically controllable RF circuit operates as a tunable patch antenna whose one or more frequency characteristics and/or directionality can be changed by changing one or more bias voltages applied to the EC cell and EAP-based actuator. Advantageously, the capability to tune the antenna using two different tuning mechanisms (i.e., a dielectric-constant based tuning mechanism implemented using the EC cell and a geometry-based tuning mechanism implemented using the EAP-based actuator) provides more degrees of control over the pertinent antenna characteristics compared to what is available in some other antenna designs.

In another example embodiment, the electrically controllable RF circuit can operate as a tunable RF filter whose one or more frequency characteristics can similarly be changed using the two different tuning mechanisms.

According to an example embodiment, provided is an apparatus comprising an electrical circuit connected to process an electrical radio-frequency (RF) signal, the electrical circuit including an electrically conducting patch, an EC cell, and an electro-mechanical actuator; wherein the EC cell comprises an EC layer sandwiched between first and second electrodes, the second electrode being electromagnetically coupled to the electrically conducting patch; and wherein the electro-mechanical actuator comprises an electro-active (EA) polymer configured to generate relative movement of the electrically conducting patch and the second electrode in response to a bias voltage.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Some embodiments disclosed herein may benefit from the use of some features disclosed in U.S. Pat. Nos. 10,033,080 and 10,187,107, U.S. Patent Application Publication Nos. 2015/0325897 and 2018/0301783, and U.S. Patent application Ser. Nos. 15/978,370 and 16/562,871, all of which are incorporated herein by reference in their entirety.

The term "radio frequency" (often abbreviated as RF) refers to a rate of oscillation in the range from about 3 kHz to about 300 GHz. This term may be used in reference to carrier frequencies of alternating electrical currents and (wireless) radio waves and in reference to the spectral content of modulation waveforms, e.g., used in optical signals.

A patch antenna can be manufactured by forming a conducting ground plane at one side of a substrate or printed circuit board and a conducting patch at the other side of the substrate/board. However, one problem with this antenna structure is that it has a relatively narrow, fixed bandwidth due to its highly resonant characteristics. At least some aspects of this problem can be addressed using tunable patch antennas. In particular, tunable patch antennas that have relatively low cost and/or are suitable for mass production are highly desirable.

Figure 1A:
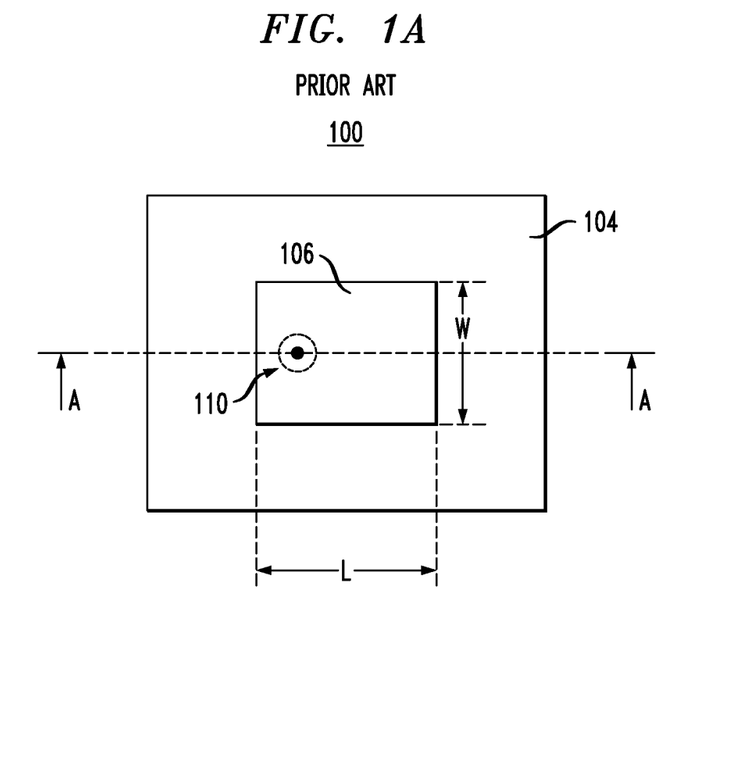
FIGS. 1A-1B show top and cross-sectional side views, respectively, of a conventional patch antenna.
Figure 1B:
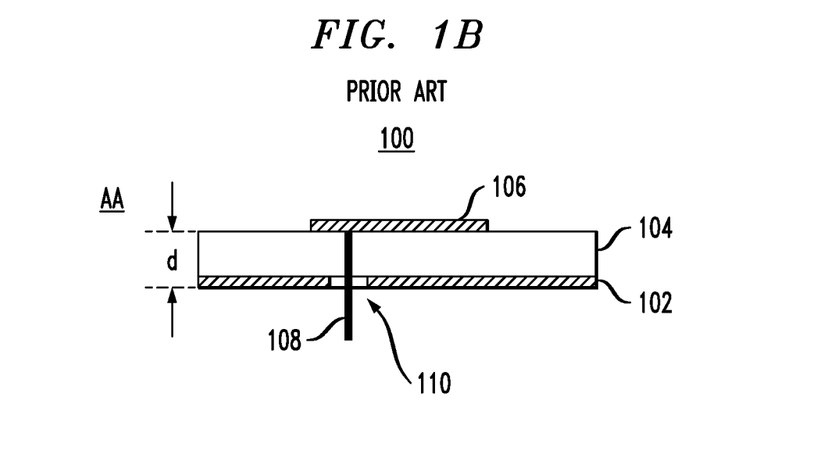

FIGS. 1A-1B show top and cross-sectional side views, respectively, of a conventional patch antenna 100. Antenna 100 has a flat rectangular conductor (patch) 106 of length L and width W placed at a relatively small offset distance (d) from a conducting ground plane 102. Patch 106 is supported on a dielectric substrate 104 having electric permittivity ε. A conducting probe (wire) 108 fed through an opening 110 in ground plane 102 couples patch 106 to an external RF transmission line (not explicitly shown in FIGS. 1A-1B). Probe 108 does not have a direct electrical contact with ground plane 102.

A drive signal applied via probe 108 to patch 106 can excite a mode oscillating across the patch's length L and/or width W. Assuming that L is greater than W, the fundamental mode (which is of primary interest in the antenna design) is the mode oscillating across the length L. With respect to this mode, antenna 100 is at resonance if the length L is about one half of the signal wavelength in the material of substrate 104. More precisely, the relationship between the length L and the free-space wavelength λ are given by Eq. (1):

$$L \approx 0.49 \lambda / \sqrt{\varepsilon} \qquad (1)$$

At the resonant frequency, antenna 100 radiates energy very effectively and can be easily impedance matched to the external RF transmission line. The bandwidth (BW) of antenna 100 can be approximated using Eq. (2):

$$BW = 3.77 \times \frac{(\varepsilon - 1) L d}{\varepsilon^2 W \lambda} \qquad (2)$$

where BW is defined as the fractional bandwidth characterized by a voltage standing-wave ratio (VSWR) less than 2:1 relative to the resonant frequency (see, e.g., W. L. Stutzman and G. A. Thiele, "Antenna Theory and Design," 2nd ed. 1998, Wiley, New York, Eq. 5-77, p. 215, which is incorporated herein by reference in its entirety).

For planar and conformal antennas, it is desirable to make the thickness d as small as possible. However, Eq. (2) indicates that decreasing d will reduce the bandwidth accordingly. For many applications, it is also desirable to make the lateral dimensions of the antenna (e.g., L and W) as small as possible without affecting the resonant frequency. This size reduction can be achieved, e.g., by increasing electric permittivity ε. However, Eq. (2) indicates that increasing ε will also reduce the bandwidth. Note that, although Eq. (2) states that reducing W will increase the bandwidth, it is typically necessary to maintain a particular aspect ratio (L/W) to obtain a specified radiation resistance and good impedance matching. Thus, the aspect ratio cannot be changed arbitrarily to improve the bandwidth.

For many applications, it is desirable to have a planar or conformal antenna that retains some of the advantageous characteristics (e.g., thin, low profile and suitable directionality) of the patch antenna, but has, at a comparable size, an enhanced or tunable bandwidth. Note also that patch antennas designed for low-frequency (e.g., <500-MHz) applications can become relatively heavy (e.g., have a weight of about one pound or more), primarily due to the relatively large size and weight of the dielectric substrate. For such applications, it is desirable to reduce the physical size of the low-frequency antennas and/or the amount of (relatively heavy) dielectric materials used therein.

Behavior of a resonant structure can be analyzed and understood by considering its natural modes of oscillation. An effective resonant antenna possesses a natural mode of oscillation that couples strongly to radiation modes. The strength of this coupling can be quantified using a parameter known as the quality factor (Q or Q-factor) of the resonant mode, which is proportional to the ratio of stored energy to radiated power. The quality factor depends on the rate at which the resonant mode transfers energy into radiation modes. A lower Q corresponds to a higher energy-transfer rate and stronger emission.

To control the bandwidth of a resonant antenna, one can control the radiation Q-factor of its resonant mode because the bandwidth of the antenna varies inversely with the Q-factor. A real-life antenna also has some energy absorption, e.g., due to conductor or dielectric losses. Absorption losses reduce the overall Q-factor of the antenna, but also reduce the radiation efficiency of the antenna, the latter being an undesirable effect. Therefore, when one seeks to minimize the Q-factor, it is the radiation Q-factor that needs to be minimized (i.e., the Q as determined solely from radiation damping of the mode). By changing the radiation Q, one can also change the efficiency, i.e., the fraction of the modal energy dissipated through radiation rather than through absorption.

Figure 2:
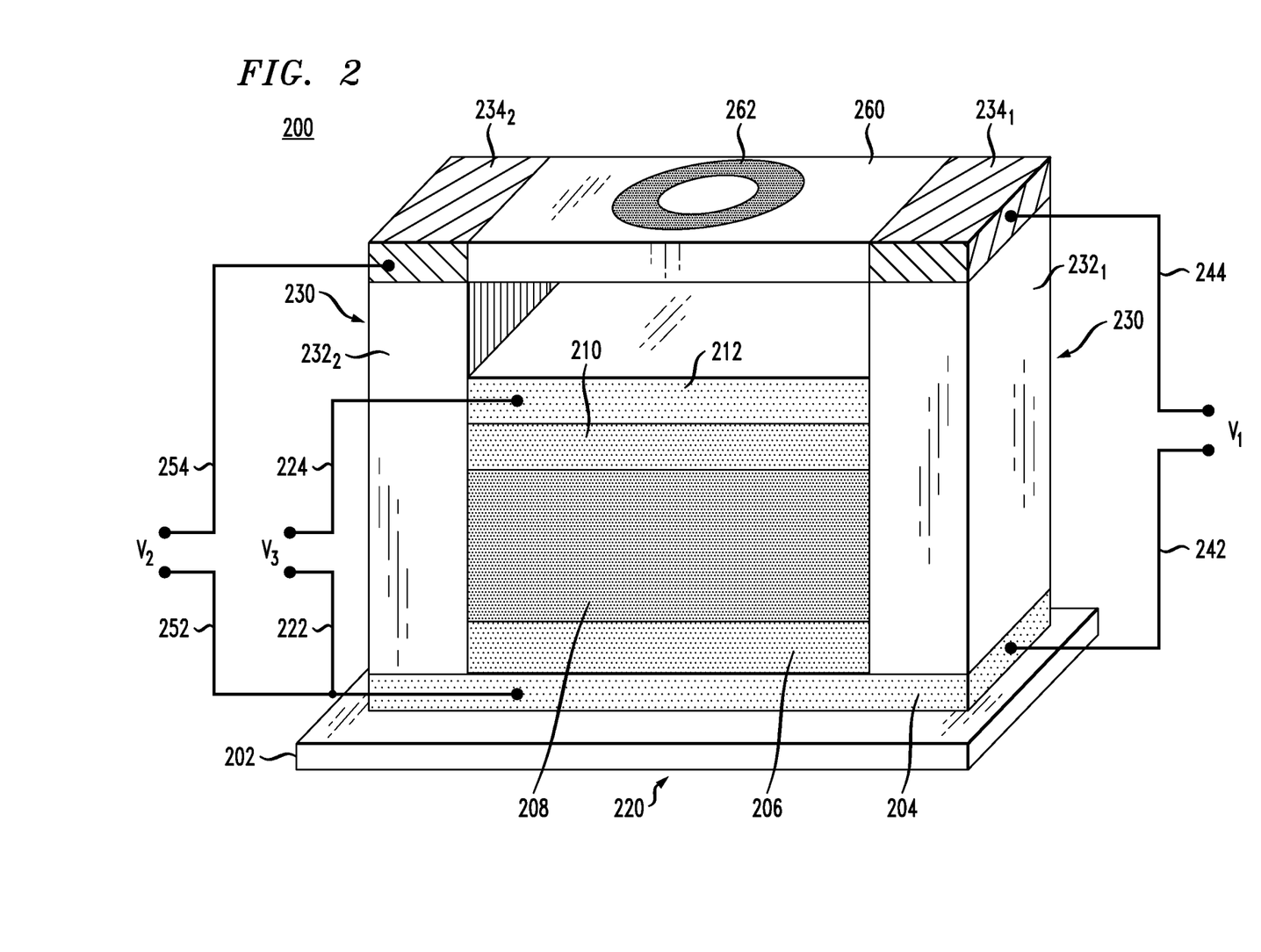
FIG. 2 schematically shows a patch antenna according to an embodiment.
Figure 3:
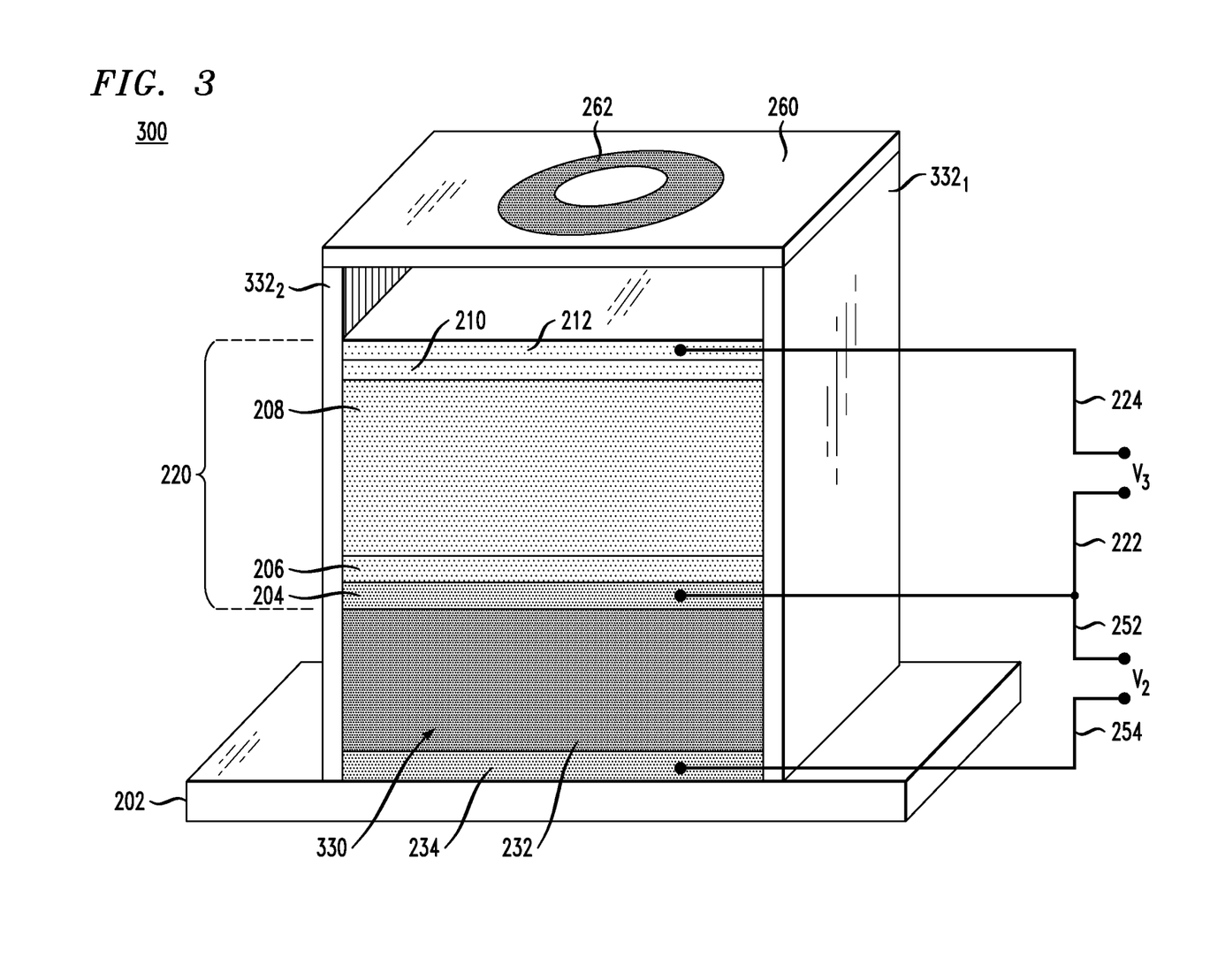
FIG. 3 schematically shows a patch antenna according to an alternative embodiment.

For many practical purposes, the antenna structure without the presence of a transmission-line feed can be considered first, e.g., as shown and described in reference to FIGS. 2-3. The unfed structure, hereafter referred to as the resonator, possesses one or more natural modes of oscillation. Typically, it is desirable to identify a single fundamental resonant mode with a relatively low radiation Q-factor, and then utilize this mode in the operation of the antenna. The resonator structure may also possess other, higher-order modes having Q-factors higher than and radiation patterns different from those of the fundamental mode. These higher-order modes may be excited to a small degree over the operating bandwidth of the antenna. However, the properties of the antenna within the operating bandwidth are dominated by the fundamental mode.

After designing a resonator having a fundamental resonant mode and Q-factor suitable for the intended application, the typical next step is to incorporate a feed into the resonator structure to enable it to function as an antenna. It is desirable for the feed to excite the resonant mode in such a manner that the transmission-line impedance can be matched to the antenna impedance. This result can be achieved when the radiation resistance of the antenna has a value that is relatively close to the transmission line impedance and when the reactance of the antenna is close to zero at the matched frequency. It is known in the pertinent art that lumped element capacitors and/or inductors can be used to assist in the impedance matching (for example, to tune the reactance to zero). The antenna impedance seen at the feed point can also be modified by appropriately changing the geometry and/or placement of the feed. It is desirable for the feed to effectively excite the fundamental mode of the resonator. When the feed is incorporated into the resonator with minimum disturbance to the resonator structure, the modal analysis performed on the unfed resonator is sufficiently accurate in predicting the operating frequency and bandwidth of the impedance-matched antenna. In some configurations, the feed structure may present geometric features that modify the modal behavior of the underlying resonator structure. In these cases, it might be helpful to incorporate certain aspects of the feed structure into the modal analysis of the resonator to better predict the antenna behavior. A person of ordinary skill in the art will be able to incorporate a suitable feed structure into the disclosed unfed resonator structures without any undue experimentation. For example, many different feed structures are described in sufficient detail in the pertinent literature and are practically available for these purposes.

An electrochromic (EC) material is broadly defined as a material whose optical absorption/transmission characteristics can be reversibly changed by application of an external voltage, light, or electric field. Representative examples of EC materials include but are not limited to (i) transition-metal and inorganic oxides, such as tungsten oxide; (ii) small organic molecules, such as viologens; and (iii) polymers, such as poly-viologens and derivatives of poly-thiophene, polypyrrole, and polyaniline.

Conventional applications of EC materials typically utilize and rely on the changes in the characteristics of EC materials in the visible range of the electromagnetic spectrum, e.g., as detailed in the review article by Avni A. Argun, Pierre-Henri Aubert, Barry C. Thompson, et al., entitled "Multicolored Electrochromism in Polymers: Structures and Devices," published in Chem. Mater., 2004, v. 16, pp. 4401-4412, which is incorporated herein by reference in its entirety. However, for at least some EC materials, changes in the visible range of the electromagnetic spectrum may be accompanied by relatively strong concurrent changes of the dielectric constant(s) in the RF or microwave range of the electromagnetic spectrum. As a result, some EC materials can be used to create electrically controlled, tunable circuit elements for certain RF and/or microwave applications, e.g., as explained in more detail below.

An electro-active (EA) polymer, or EAP, is a polymer that exhibits a change in size or shape when stimulated by an electric field. A typical characteristic property of an EAP is that it can undergo a large amount of deformation while sustaining and withstanding large forces. The most common applications of EAPs are in actuators and sensors. Historically, most actuators were made of ceramic piezoelectric materials. Although ceramic piezoelectric materials are able to withstand large forces, they will typically deform only a fraction of a percent. In contrast, many EAPs can reversibly exhibit over a 20% strain, which is much greater than that of any ceramic piezoelectric material. Some EAPs can even exhibit over a 300% strain. Representative examples of EAPs include but are not limited to (i) electronic electro-active polymers, such as piezoelectric polymers, ferroelectric polymers, electrostrictive polymers, and dielectric elastomers; (ii) ionic electro-active polymers, such as polyelectrolyte gels, ionic polymer-metal composites, carbon nanotubes, and conducting polymers; and (iii) electro-active polymer composites (see, e.g., U.S. Pat. No. 7,369,396, which is incorporated herein by reference in its entirety).

FIG. 2 schematically shows a patch antenna 200 according to an embodiment. Antenna 200 is supported on a device carrier or substrate 202. In an example embodiment, device carrier 202 can comprise a semiconductor or dielectric layer or a circuit board. In some embodiments, device carrier 202 may comprise other functionally/structurally suitable structures.

In an example embodiment, antenna 200 comprises an EC cell 220, an electro-mechanical (e.g., micro-electro-mechanical systems, MEMS) actuator 230, and a radome 260.

In an example embodiment, EC cell 220 comprises layers 204, 206, 208, 210, and 212.

Layers 204 and 212 are electrode layers that are configured to be electrically connected, by way of electrical leads 222 and 224, to an external voltage source, e.g., supplying a dc bias voltage, $V_3$, as indicated in FIG. 2. In an example embodiment, layer 212 is made of an electrically conducting material (e.g., a metal or metallic alloy) and can operate as an anode. Layer 204 is also made of an electrically conducting material and can operate as a cathode. The electrically conducting material of layer 212 may be the same as or different from the electrically conducting material of layer 204. In some embodiments, one or both of electrode layers 204 and 212 may include gold.

In some embodiments, electrode layer 204 can be implemented using a base (e.g., ground) plane of the corresponding RF circuit. Electrode layer 212 serves as a "patch" of patch antenna 200 and can be formed, e.g., by patterning and etching an RF-transmission layer of the corresponding RF circuit.

Layer 206 is an EC layer that may comprise any suitable EC material, such as $WO_3$, $TiO_2$, $MoO_3$, $Ta_2O_5$, $Nb_2O_5$, or any of other above-mentioned or known EC materials.

Layer 208 is an ion-conductor (e.g., solid electrolyte) layer that serves as a reservoir of ions for injection into/ejection from EC layer 206. In some embodiments, layer 208 may comprise lithium niobate ($LiNbO_3$).

Layer 210 is an ion-storage layer. In some embodiments, layer 210 may comprise an EC material that exhibits electrochromic characteristics complementary to those of EC layer 206. In some embodiments, layer 210 may be made of NiO, $Cr_2O_3$, $MnO_2$, $FeO_2$, $CoO_2$, $RhO_2$, and/or $IrO_2$.

When voltage $V_3$ is applied between electrical leads 222 and 224, a corresponding electric field is generated between electrode layers 204 and 212. This electric field causes ions to be injected into and/or ejected from EC layer 206. The resulting electrical charge in EC layer 206 is neutralized by a corresponding charge-balancing counter flow of electrons. This injection/ejection of ions and electrons typically causes a change of optical properties, such as color, in EC layer 206 due to electrochromism. This injection/ejection of ions and electrons also typically causes a change of the dielectric constant in EC layer 206 in the RF or microwave range of the electromagnetic spectrum, with said change being voltage-dependent.

In an example embodiment, actuator 230 comprises EAP blocks $232_1$ and $232_2$ placed at opposite sides of EC cell 220 on electrode layer 204, which serves as a common electrode for the EC cell and actuator. Actuator 230 further comprises electrodes $234_1$ and $234_2$ located at the other end of EAP blocks $232_1$ and $232_2$, respectively, as indicated in FIG. 2. Electrode $234_1$ can be electrically biased with respect to electrode layer 204 by an external voltage source, e.g., configured to apply a dc bias voltage $V_1$ between electrical leads 242 and 244. Electrode $234_2$ can be similarly electrically biased with respect to electrode layer 204 by an external voltage source, e.g., configured to apply a dc bias voltage $V_2$ between electrical leads 252 and 254. In this case, the voltages $V_1$ and $V_2$ can be selected and changed independent of one another and of the voltage $V_3$. In some embodiments, electrodes $234_1$ and $234_2$ can be connected to the same external voltage source, in which case $V_1=V_2$.

Radome 260 can be attached to actuator 230 between EAP blocks $232_1$ and $232_2$ at a suitable vertical offset distance from electrode layer 212, e.g., as indicated in FIG. 2. In an example embodiment, there is an air gap between electrode layer 212 and radome 260. Radome 260 is typically made of a material (e.g., a polymer or composite) that minimally attenuates the electromagnetic signals (e.g., radio waves) transmitted and/or received by antenna 200 and can be used, e.g., to protect sensitive circuits of antenna 200 from the adverse effects of weather and/or to conceal some electronic components of the antenna from view.

Radome 260 is further used to support thereon a ring-shaped patch 262. In an example embodiment, patch 262 can be made of an electrically conducting material, such as a metal or metal alloy. The vertical offset distance between electrode layer 212 and patch 262 is selected to be relatively small to cause the patch to be electromagnetically (EM) coupled (through space) to said electrode layer. Due to this EM coupling, patch 262 may sometimes be referred to as a "parasitic" patch. Patch 262 does not typically have any direct electrical connections to other circuit elements and, as such, is an electrically floating element.

In alternative embodiments, patch 262 can have other suitable shapes, e.g., rectangular, oval, etc.

Small air gaps typically present between EAP blocks $232_1$ and $232_2$ and the adjacent sidewalls of EC cell 220 allow MEMS actuator 230 to move radome 260 and patch 262 with respect to electrode layer 212 in response to the voltages $V_1$ and $V_2$. In the shown embodiment, both relative translation and rotation are possible. For example, changing the voltages while keeping $V_1=V_2$ can vertically translate radome 260 and patch 262 with respect to electrode layer 212. In contrast, when $V_1 \neq V_2$, radome 260 and patch 262 can be tilted with respect to electrode layer 212. A person of ordinary skill in the art will understand that a change in the relative position of patch 262 and electrode layer 212 can affect the strength of EM coupling between them and, as a result, at least some characteristics of antenna 200. Herein, the term "vertical" refers to a direction that is orthogonal to a main plane of substrate 202.

In operation, any of the voltages $V_1$, $V_2$, and $V_3$ can be used to tune antenna 200. More specifically, the voltage $V_3$ can affect the resonant frequency and/or bandwidth of antenna 200 due to the corresponding change of the effective dielectric constant of EC cell 220 (also see Eqs. (1)-(2)). The voltages $V_1$ and $V_2$ can affect the resonant frequency and/or bandwidth of antenna 200 due to their effect on the relative positions of and electromagnetic coupling between patch 262 and electrode layer 212. Advantageously, the capability to use two different tuning mechanisms (i.e., a dielectric-constant based mechanism and a geometry-based mechanism) in antenna 200 provides more degrees of control over the pertinent antenna characteristics compared to what is available in some other antenna designs.

FIG. 3 schematically shows a patch antenna 300 according to an alternative embodiment. Antenna 300 is constructed using many of the same elements as antenna 200 (FIG. 2). These elements are labeled in FIG. 3 using the same numerical labels as in FIG. 2. The description of these elements is not repeated here. Rather, the description of antenna 300 primarily focuses on the differences between antennas 200 and 300.

As shown in FIG. 3, antenna 300 comprises EC cell 220, an electro-mechanical actuator 330, radome 260, and EM-coupled patch 262.

EC cell 220 comprises layers 204, 206, 208, 210, and 212 and can be electrically biased using an external voltage source connected to apply the voltage $V_3$ between electrical leads 222 and 224.

In this embodiment, radome 260 and EM-coupled patch 262 are fixedly attached to device carrier or substrate 202 by fixed support beams or legs $332_1$ and $332_2$. EC cell 220 and actuator 330 are vertically stacked under radome 260 in the space between the fixed support beams $332_1$ and $332_2$, as indicated in FIG. 3.

Actuator 330 comprises electrode layers 204 and 234 and EAP block 232 sandwiched between those electrode layers. Electrode layer 204 is shared by (i.e., is a common element to) EC cell 220 and actuator 330. Electrode layer 234 is electrically insulated from device carrier or substrate 202 and can be electrically biased with respect to electrode layer 204 by an external voltage source, e.g., configured to apply the voltage $V_2$ between electrical leads 252 and 254.

In some embodiments, electrode layer 234 and device carrier or substrate 202 can be electrically connected to be at the same electrical potential.

Small air gaps typically present between support beams $332_1$ and $332_2$ and the adjacent sidewalls of EC cell 220 and actuator 330 allow the actuator to move the EC cell with respect to device carrier or substrate 202, radome 260, and patch 262 in response to the voltage $V_2$. In this particular embodiment, this movement primarily comprises relative translation. A person of ordinary skill in the art will understand that a change in the relative position of patch 262 and electrode layer 212 of EC cell 220 can affect the strength of EM coupling between them and, as a result, at least some characteristics of antenna 300.

In operation, one or both of the voltages $V_2$ and $V_3$ can be used to tune antenna 300. More specifically, the voltage $V_3$ can affect the resonant frequency and/or bandwidth of antenna 300 due to the corresponding change of the effective dielectric constant E of EC cell 220 (also see Eqs. (1)-(2)). The voltage $V_2$ can affect the resonant frequency and/or bandwidth of antenna 300 due to its effect on the relative position of and electromagnetic coupling between patch 262 and electrode layer 212, as indicated above.

Figure 4:
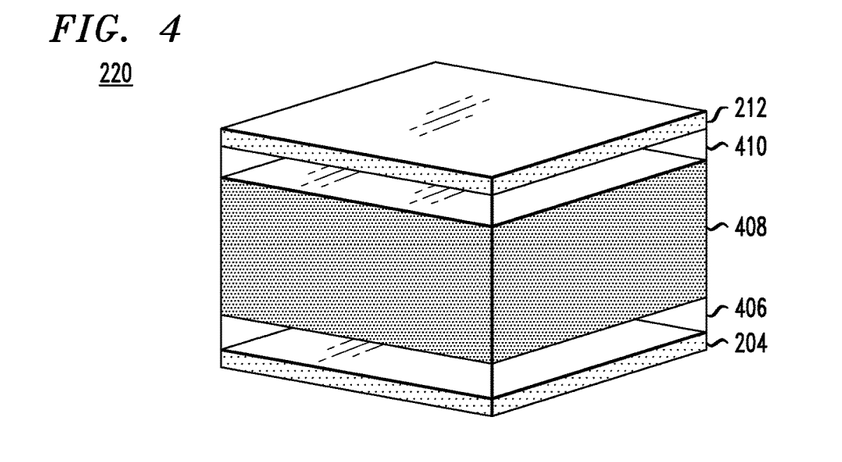
FIG. 4 shows a schematic view of an electrochromic (EC) cell that can be used in some embodiments of the antennas shown in FIGS. 2 and 3.

FIG. 4 shows a schematic view of EC cell 220 that can be used in some embodiments of antennas 200 and 300. In the embodiment of FIG. 4, EC cell 220 comprises layers 204, 406, 408, 410, and 212.

Layers 204 and 212 are the electrode layers already described above.

Layer 408 is an EC layer that may comprise any suitable EC material, such as $WO_3$, $TiO_2$, $MoO_3$, $Ta_2O_5$, $Nb_2O_5$, or any of other above-mentioned or known EC materials. In some embodiments, EC layer 408 may have first and second sub-layers (not explicitly shown in FIG. 4, see FIG. 5). In such embodiments, the first sub-layer may be an EC sub-layer (i.e., made of any suitable EC material indicated above), and the second sub-layer may be an ion-storage sub-layer. In some embodiments, it may be beneficial to make the second sub-layer of an EC material that exhibits electrochromic characteristics complementary to those of the first EC sub-layer. In some embodiments, the second sub-layer may be made of $NiO$, $Cr_2O_3$, $MnO_2$, $FeO_2$, $CoO_2$, $RhO_2$, and/or $IrO_2$.

Layers 406 and 410 are ion-conductor (e.g., solid electrolyte) layers that serve as reservoirs of ions for injection into/ejection from EC layer 408. It may be beneficial to make ion-conductor layers 406 and 410 from a material that has different conductivities for ions and electrons. In some embodiments, layers 406 and 410 may be made of different respective materials. In some embodiments, layers 406 and 410 may comprise the same material, e.g., lithium niobate ($LiNbO_3$).

Figure 5:
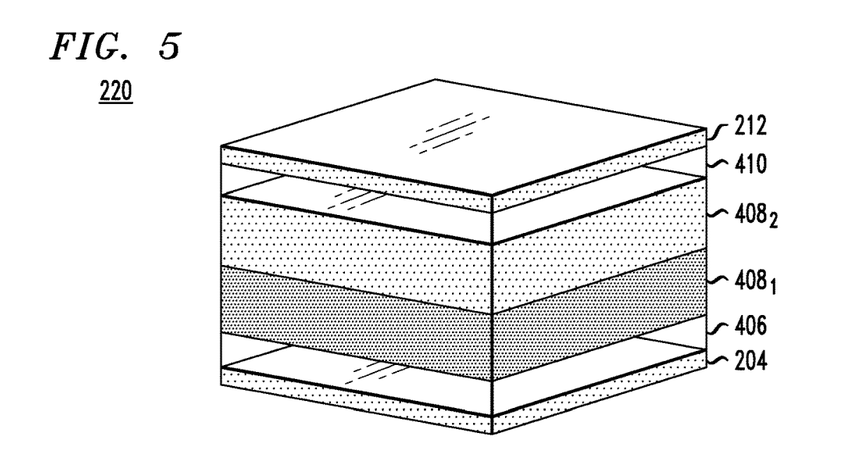
FIG. 5 shows a schematic view of an EC cell that can be used in some other embodiments of the antennas shown in FIGS. 2 and 3.

FIG. 5 shows a schematic view of EC cell 220 that can be used in some other embodiments of antennas 200 and 300. In the embodiment of FIG. 5, layer 408 comprises sub-layers $408_1$ and $408_2$. Sub-layer $408_1$ is an EC sub-layer that can be made of any suitable EC material indicated above. Sub-layer $408_2$ is an ion-storage sub-layer. In some embodiments, it may be beneficial to make the second sub-layer of an EC material that exhibits electrochromic characteristics complementary to those of sub-layer $408_1$. In some embodiments, sub-layer $408_1$ may comprise $NiO$, $Cr_2O_3$, $MnO_2$, $FeO_2$, $CoO_2$, $RhO_2$, or $IrO_2$.

Figure 6:
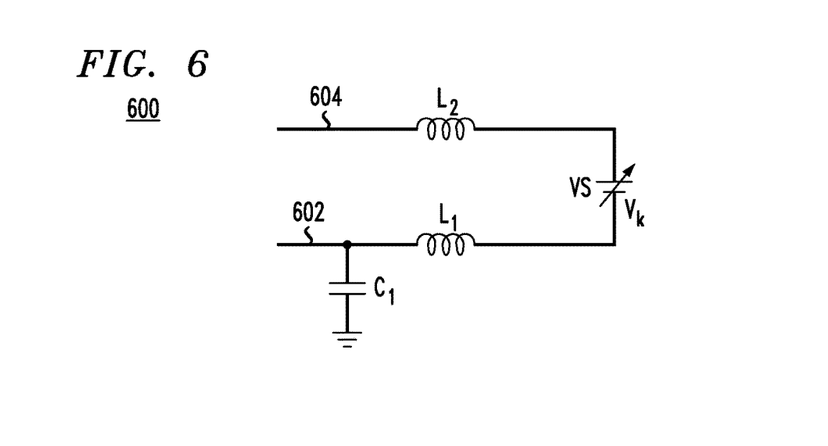
FIG. 6 shows a circuit diagram of a voltage source that can be used to generate bias voltages for the antennas shown in FIGS. 2 and 3 according to an embodiment.

FIG. 6 shows a circuit diagram of a voltage source 600 that can be used to generate bias voltages for antennas 200 and 300 according to an embodiment. For example, different instances of voltage source 600 can be used to generate the voltages $V_1$, $V_2$, and $V_3$ (also see FIGS. 2-3).

Voltage source 600 comprises a variable voltage source VS connected to generate a voltage $V_k$ (where k=1, 2, or 3) between electrical terminals 602 and 604. The bias voltage $V_k$ can be changed by appropriately controlling the voltage source VS, as known in the pertinent art. Inductors $L_1$ and $L_2$ are used to provide dc coupling of the voltage source VS to EC cell 220 or actuator 230 or 330. Since inductors $L_1$ and $L_2$ have relatively high impedances at radio frequencies, voltage source VS is substantially RF-decoupled from the load connected to electrical terminals 602 and 604. Capacitor $C_1$ may be optional and serves to electrically float electrical terminal 602 with respect to the ground potential, when appropriate or necessary. In some embodiments, electrical terminal 602 can be directly electrically connected to the corresponding ground terminal of the circuit, in which case capacitor $C_1$ is not needed and may not be present.

To apply the voltage $V_1$, electrical terminals 602 and 604 of voltage source 600 can be connected to electrical leads 242 and 244, respectively (also see FIG. 2). To apply the voltage $V_2$, electrical terminals 602 and 604 of voltage source 600 can be connected to electrical leads 252 and 254, respectively (also see FIGS. 2 and 3). To apply the voltage $V_3$, electrical terminals 602 and 604 of voltage source 600 can be connected to electrical leads 222 and 224, respectively (also see FIGS. 2 and 3).

Figure 7:
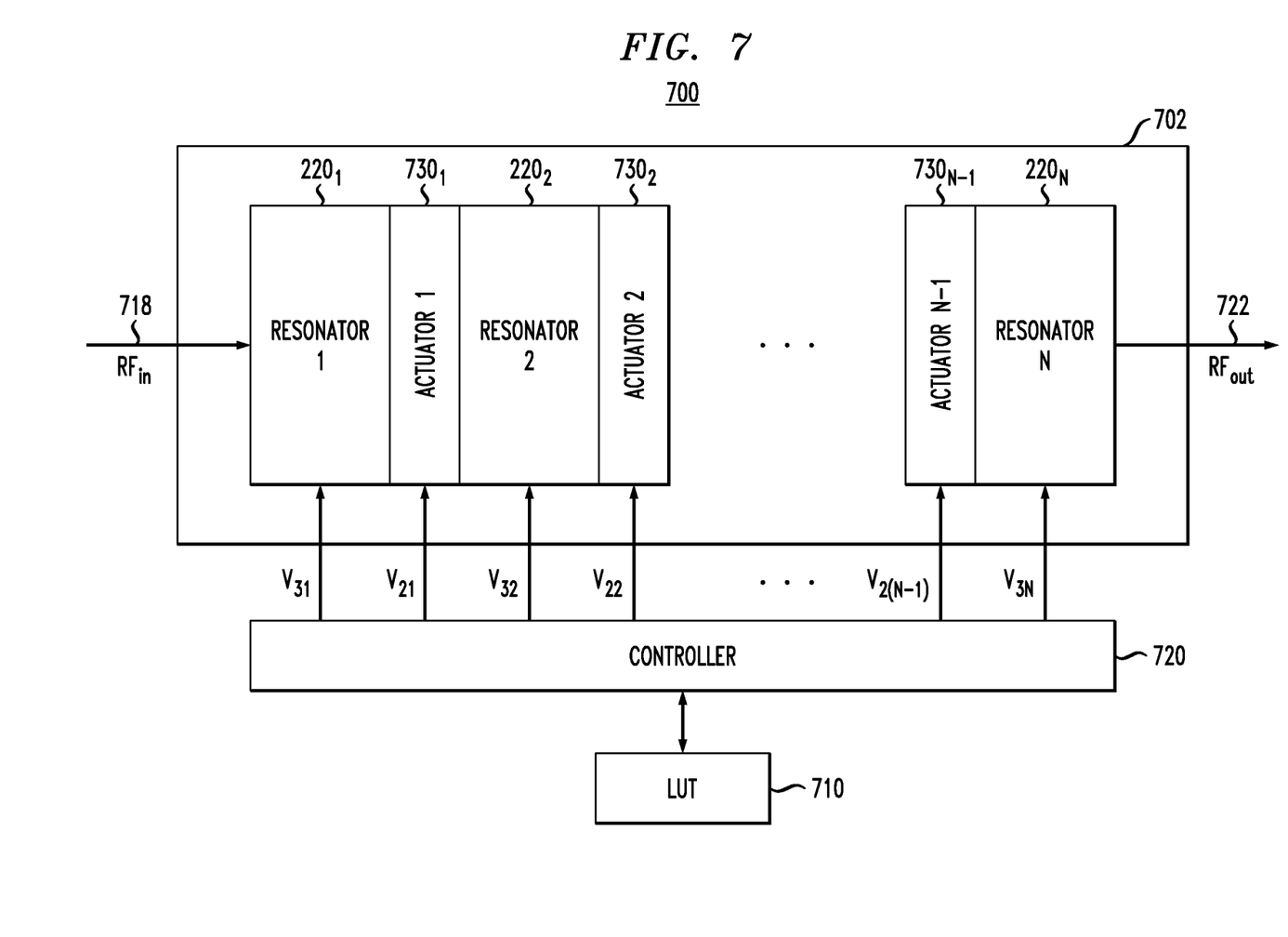
FIG. 7 shows a block diagram of a tunable filter according to an embodiment.

FIG. 7 shows a block diagram of a tunable RF filter 700 according to an embodiment. Filter 700 comprises a plurality of EM-coupled RF resonators, each comprising a respective instance of EC cell 220, which are labeled $220_1$-$220_N$, where N is an integer greater than one. Resonators $220_1$-$220_N$ are supported on a device carrier 702 in a manner that allows relative movement of the resonators with respect to each other, e.g., translations on or along a main surface of the device carrier. An RF-input line 718 is configured to couple an RF input signal $RF_{in}$ into resonator $220_1$. An RF-output line 722 is configured to couple a filtered RF signal $RF_{out}$ out of resonators $220_N$. In various embodiments, the RF-line coupling to the corresponding resonator 220 for lines 718 and 722 can be implemented using a tapped-resonator connection, an inductive loop, or a capacitive probe, e.g., as known in the pertinent art. In a fixed configuration, filter 700 operates similar to a combline filter.

Filter 700 further comprises (N−1) EAP-based electromechanical (e.g., MEMS) actuators 730, which are labeled $730_1$-$730_{N-1}$. Although three actuators 730 are explicitly shown in FIG. 7 for illustration purposes, embodiments with fewer or more actuators 730 are also possible. For example, an embodiment corresponding to N=2 may have a single actuator 730. An embodiment corresponding to N=3 may have two actuators 730, and so on.

In an example embodiment, an actuator 730 comprises an EAP block sandwiched between two electrodes that can be electrically biased to induce expansion or contraction of the EAP block, e.g., as described in reference to actuators 230 and 330 (FIGS. 2 and 3). An actuator $730_n$ is attached between resonators $220_n$ and $220_{n+1}$ such that a change of the bias voltage $V_{2n}$ applied to the actuator and the resulting expansion or contraction of the EAP block therein causes a corresponding change in the relative distance between those resonators. A person of ordinary skill in the art will understand that a relative-distance change for resonators $220_n$ and $220_{n+1}$ typically causes a corresponding change in the strength of EM coupling between them.

Filter 700 further comprises an electronic controller 720 connected to resonators $220_1$-$220_N$ and actuators $730_1$-$730_{N-1}$ as indicated in FIG. 7. In an example embodiment, controller 700 includes a plurality of voltage sources 600 (FIG. 6), each configured to generate a respective one of the voltages $V_{31}, \ldots, V_{3N}$ and $V_{21}, \ldots, V_{2(N-1)}$. Each of the voltages $V_{31}, \ldots, V_{3N}$ can be applied to control the characteristics of a respective one of resonators $220_1$-$220_N$, e.g., as explained in reference to FIGS. 2-3. Each of the voltages $V_{21}, \ldots, V_{2(N-1)}$ can be applied to control the characteristics of a respective one of actuators $730_1$-$730_{N-1}$, e.g., as explained in reference to FIGS. 2-3.

In operation, controller 720 can independently change any of the voltages $V_{31}, \ldots, V_{3N}$ and $V_{21}, \ldots, V_{2(N-1)}$, thereby changing at least some RF characteristics of filter 700. For example, a change of any one of the voltages $V_{31}, \ldots, V_{3N}$ can affect the resonant frequency and/or bandwidth of the corresponding resonator 220 due to the corresponding change of its effective dielectric constant, e.g., as explained above. Any one of the voltages $V_{21}, \ldots, V_{2(N-1)}$ can affect the RF characteristics of filter 700 due to its effect on the EM coupling between the corresponding resonators $220_n$ and $220_{n+1}$, as indicated above.

In some embodiments, controller 720 can be configured to use a plurality of preset configurations, the parameters of which are stored in a look-up table (LUT) 710. In such embodiments, the filter-configuration data stored in LUT 710 enable controller 720 to quickly and efficiently match a set of requested frequency characteristics of filter 700 to a corresponding set of voltage values for the voltages $V_{31}, \ldots, V_{3N}$ and $V_{21}, \ldots, V_{2(N-1)}$. Those voltage values can then be read from LUT 710 and used by controller 720 to generate the actual voltages $V_{31}, \ldots, V_{3N}$ and $V_{21}, \ldots, V_{2(n-1)}$, thereby tuning filter 700 to approximately exhibit the requested frequency characteristics. The use of LUT 710 can be beneficial, e.g., when filter 700 needs to be retuned relatively quickly and/or relatively often.

At least some embodiments of controller 720 and LUT 710 can be adapted for tuning and controlling some frequency characteristics of antenna 200 or 300.

According to an example embodiment disclosed above, e.g., in the summary section and/or in reference to any one or any combination of some or all of FIGS. 1-7, provided is an apparatus comprising: an electrical circuit (e.g., 200, FIG. 2; 300, FIG. 3; 700, FIG. 7) connected to process an electrical radio-frequency (RF) signal, the electrical circuit including an electrically conducting patch (e.g., 262, FIGS. 2, 3; 212 of $220_2$, FIGS. 4-5, 7), an electrochromic (EC) cell (e.g., 220, FIGS. 2, 3; $220_1$, FIGS. 4-5, 7), and an electro-mechanical actuator (e.g., 230, FIG. 2; 330, FIG. 3; 730, FIG. 7); wherein the EC cell comprises an EC layer (e.g., 206, FIG. 2) sandwiched between first and second electrodes (e.g., 204, 212, FIG. 2), the second electrode (e.g., 212, FIG. 2) being electromagnetically coupled to the electrically conducting patch; and wherein the electro-mechanical actuator comprises an electro-active (EA) polymer (e.g., $232_1$, FIG. 2; 232, FIG. 3) configured to generate relative movement of the electrically conducting patch and the second electrode in response to a bias voltage (e.g., $V_2$, FIGS. 2, 3).

In some embodiments of the above apparatus, the electro-mechanical actuator (e.g., 330, FIG. 3) is configured to generate relative translation of the electrically conducting patch and the second electrode in response to the bias voltage.

In some embodiments of any of the above apparatus, the electro-mechanical actuator (e.g., 230, FIG. 2) is configured to generate relative rotation of the electrically conducting patch and the second electrode.

In some embodiments of any of the above apparatus, the EA polymer is located between the first electrode (e.g., 204, FIG. 2) and a third electrode (e.g., $234_1$, FIG. 2), the bias voltage being applied between the first and third electrodes.

In some embodiments of any of the above apparatus, the apparatus further comprises a substrate (e.g., 202, FIG. 2); wherein the second electrode is fixedly supported at a fixed offset distance from the substrate; and wherein the electromechanical actuator is configured to move the electrically conducting patch with respect to the substrate in response to the bias voltage.

In some embodiments of any of the above apparatus, the apparatus further comprises a substrate (e.g., 202, FIG. 3); wherein the electrically conducting patch is fixedly supported at a fixed offset distance from the substrate; and wherein the electro-mechanical actuator is configured to move the second electrode (e.g., 212, FIG. 3) with respect to the substrate in response to the bias voltage.

In some embodiments of any of the above apparatus, the electrical circuit is a tunable antenna (e.g., 200, FIG. 2; 300, FIG. 3) that includes the electrically conducting patch, the EC cell, and the electro-mechanical actuator.

In some embodiments of any of the above apparatus, the tunable antenna comprises a radome (e.g., 260, FIG. 2); and wherein the electrically conducting patch is fixedly attached to the radome or is a part of the radome.

In some embodiments of any of the above apparatus, the apparatus further comprises an electronic controller (e.g., 720, FIG. 7) configured to change one or more RF characteristics of the electrical circuit by changing the bias voltage.

In some embodiments of any of the above apparatus, the electronic controller is further configured to change one or more RF characteristics of the electrical circuit by changing a voltage (e.g., $V_3$, FIGS. 2, 3) applied between the first and second electrodes.

In some embodiments of any of the above apparatus, the electronic controller is configured to change one or more RF characteristics of the electrical circuit using preprogrammed voltage settings stored in an electronic look-up table (e.g., 710, FIG. 7).

In some embodiments of any of the above apparatus, the electrical circuit is a tunable RF filter (e.g., 700, FIG. 7) that comprises first and second electromagnetically coupled RF resonators (e.g., $220_1$, $220_2$, FIG. 7) and the electro-mechanical actuator; wherein the first RF resonator comprises the EC cell; and wherein the second RF resonator comprises the electrically conducting patch.

In some embodiments of any of the above apparatus, the second RF resonator comprises another EC cell that includes the electrically conducting patch (e.g., 212 of $220_2$, FIG. 7).

In some embodiments of any of the above apparatus, the electro-mechanical actuator is configured to generate relative movement of the EC cell and said another EC cell.

In some embodiments of any of the above apparatus, the electrically conducting patch is not directly electrically connected to an RF-signal transmission line.

While this disclosure includes references to illustrative embodiments, this specification is not intended to be construed in a limiting sense. Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. The scale/size of certain elements in a MEMS device may be such as to permit manifestation of quantum effects. Examples of MEMS devices include, without limitation, NEMS (nano-electromechanical systems) devices, MOEMS (micro-opto-electromechanical systems) devices, micromachines, microsystems, and devices produced using microsystems technology or microsystems integration.

Although the present disclosure has been described in the context of implementation as MEMS devices, some embodiments can in theory be implemented at any scale, including scales larger than micro-scale.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the layers are horizontal but would be horizontal where the layers are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising an electrical circuit connected to process an electrical radio-frequency (RF) signal, the electrical circuit including an electrically conducting patch, an electrochromic (EC) cell, and an electro-mechanical actuator;
    wherein the EC cell comprises an EC layer sandwiched between first and second electrodes, the second electrode being electromagnetically coupled to the electrically conducting patch; and
    wherein the electro-mechanical actuator comprises an electro-active (EA) polymer configured to generate relative movement of the electrically conducting patch and the second electrode in response to a bias voltage.

2. The apparatus of claim 1, wherein the electro-mechanical actuator is configured to generate relative translation of the electrically conducting patch and the second electrode in response to the bias voltage.

3. The apparatus of claim 1, wherein the electro-mechanical actuator is configured to generate relative rotation of the electrically conducting patch and the second electrode.

4. The apparatus of claim 1, wherein the EA polymer is located between the first electrode and a third electrode, the bias voltage being applied between the first and third electrodes.

5. The apparatus of claim 1, further comprising a substrate;
    wherein the second electrode is fixedly supported at a fixed offset distance from the substrate; and
    wherein the electro-mechanical actuator is configured to move the electrically conducting patch with respect to the substrate in response to the bias voltage.

6. The apparatus of claim 1, further comprising a substrate;
    wherein the electrically conducting patch is fixedly supported at a fixed offset distance from the substrate; and wherein the electro-mechanical actuator is configured to move the second electrode with respect to the substrate in response to the bias voltage.

7. The apparatus of claim 1, wherein the electrical circuit is a tunable antenna that includes the electrically conducting patch, the EC cell, and the electro-mechanical actuator.

8. The apparatus of claim 7,
wherein the tunable antenna comprises a radome; and
wherein the electrically conducting patch is fixedly attached to the radome or is a part of the radome.

9. The apparatus of claim 1, further comprising an electronic controller configured to change one or more RF characteristics of the electrical circuit by changing the bias voltage.

10. The apparatus of claim 9, wherein the electronic controller is further configured to change one or more RF characteristics of the electrical circuit by changing a voltage applied between the first and second electrodes.

11. The apparatus of claim 9, wherein the electronic controller is configured to change one or more RF characteristics of the electrical circuit using preprogrammed voltage settings stored in an electronic look-up table.

12. The apparatus of claim 1, wherein the electrical circuit is a tunable RF filter that comprises first and second electromagnetically coupled RF resonators and the electro-mechanical actuator;
wherein the first RF resonator comprises the EC cell; and
wherein the second RF resonator comprises the electrically conducting patch.

13. The apparatus of claim 12, wherein the second RF resonator comprises another EC cell that includes the electrically conducting patch.

14. The apparatus of claim 13, wherein the electro-mechanical actuator is configured to generate relative movement of the EC cell and said another EC cell.

15. The apparatus of claim 1, wherein the electrically conducting patch is not directly electrically connected to an RF-signal transmission line.

* * * * *